(12) United States Patent
Busche et al.

(10) Patent No.: US 9,698,041 B2
(45) Date of Patent: Jul. 4, 2017

(54) SUBSTRATE TEMPERATURE CONTROL APPARATUS INCLUDING OPTICAL FIBER HEATING, SUBSTRATE TEMPERATURE CONTROL SYSTEMS, ELECTRONIC DEVICE PROCESSING SYSTEMS, AND METHODS

(71) Applicant: Applied Materials, Inc., Santa Clara, CA (US)

(72) Inventors: Matthew Busche, Santa Clara, CA (US); Wendell Boyd, Jr., Morgan Hill, CA (US); Vijay D. Parkhe, San Jose, CA (US); Michael R. Rice, Pleasanton, CA (US); Leon Volfovski, Pacifica, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 257 days.

(21) Appl. No.: 14/299,850

(22) Filed: Jun. 9, 2014

(65) Prior Publication Data

US 2015/0357228 A1    Dec. 10, 2015

(51) Int. Cl.
*H01L 21/687* (2006.01)
*H01L 21/67* (2006.01)

(52) U.S. Cl.
CPC .. *H01L 21/68714* (2013.01); *H01L 21/67103* (2013.01); *H01L 21/67109* (2013.01); *H01L 21/67115* (2013.01); *H01L 21/67248* (2013.01)

(58) Field of Classification Search
CPC ......... H01L 21/68714; H01L 21/67115; H01L 21/67103; H01L 21/6831; H01L 21/681; H01L 21/76864; H01J 37/32715; H01J 37/32733; H01J 37/32935; H01J 37/32724; H01J 37/32972; C23C 16/4586;
(Continued)

(56) References Cited

U.S. PATENT DOCUMENTS

| 4,662,368 A | 5/1987 | Hussein et al. |
| 4,702,547 A | 10/1987 | Enochs |

(Continued)

FOREIGN PATENT DOCUMENTS

| EP | 0458388 | 11/1991 |
| JP | 2003-161845 | 6/2003 |
| KR | 10-2007-0096958 | 10/2007 |

OTHER PUBLICATIONS

Busche et al., U.S. Appl. No. 14/738,448, titled: "Apparatus, Systems, and Methods for Temperature Control of Substrates Using Embedded Fiber Optics and Epoxy Optical Diffusers," filed Jun. 12, 2015.

(Continued)

*Primary Examiner* — Shawntina Fuqua
(74) *Attorney, Agent, or Firm* — Dugan & Dugan, PC (57) ABSTRACT

Substrate temperature control apparatus including optical fiber temperature control are described. Substrate temperature control apparatus includes a base, a thermal contact member proximate to the base, and a plurality of optical fibers adapted to provide light-based heating extending laterally between the base and thermal contact member. Substrate temperature control systems and electronic device processing systems and methods including optical fiber temperature control are described, as are numerous other aspects.

20 Claims, 5 Drawing Sheets

(58) Field of Classification Search
CPC ..... C23C 16/46; C23C 16/4583; C23C 16/48; C23C 16/481; C23C 16/482; C23C 16/483; C23C 16/484; C23C 14/541; C23C 14/547; G02B 6/4296
See application file for complete search history.

(56) References Cited

U.S. PATENT DOCUMENTS

| | | | |
|---|---|---|---|
| 5,363,458 | A | 11/1994 | Pan et al. |
| 5,425,831 | A | 6/1995 | Grimes et al. |
| 5,500,556 | A | 3/1996 | Kosugi |
| 5,699,461 | A | 12/1997 | Minemoto et al. |
| 6,535,685 | B1 | 3/2003 | Tullis |
| 6,646,235 | B2 | 11/2003 | Chen et al. |
| 7,519,252 | B2 | 4/2009 | Morita |
| 8,226,769 | B2 | 7/2012 | Matyushkin et al. |
| 9,196,514 | B2 * | 11/2015 | Parkhe .............. H01L 21/67109 |
| 9,224,583 | B2 * | 12/2015 | Povolny .............. C23C 16/4586 |
| 2003/0062359 | A1 | 4/2003 | Ho et al. |
| 2007/0000441 | A1 | 1/2007 | Lue |
| 2008/0019657 | A1 | 1/2008 | Maitland et al. |
| 2008/0247739 | A1 | 10/2008 | Sohtome |
| 2009/0111276 | A1 | 4/2009 | Dhindsa et al. |
| 2010/0267173 | A1 * | 10/2010 | Moffatt .............. B23K 26/0604 438/16 |
| 2011/0024047 | A1 | 2/2011 | Nguyen et al. |
| 2015/0045961 | A1 | 2/2015 | Koshti et al. |

OTHER PUBLICATIONS

Parkhe et al., U.S. Appl. No. 14/085,026, titled: "Electrostatic Chuck With Variable Pixilated Heating," filed Nov. 20, 2013.
International Search Report and Written Opinion of International Application No. PCT/US2015/032076 mailed Sep. 4, 2015.
International Preliminary Report on Patentability of International Application No. PCT/US2015/032076 mailed Dec. 22, 2016.

* cited by examiner

SUBSTRATE TEMPERATURE CONTROL APPARATUS INCLUDING OPTICAL FIBER HEATING, SUBSTRATE TEMPERATURE CONTROL SYSTEMS, ELECTRONIC DEVICE PROCESSING SYSTEMS, AND METHODS

FIELD

The present invention relates to apparatus adapted for use in electronic device manufacturing, and more specifically to apparatus and systems controlling substrate temperature during processing.

BACKGROUND

Conventional electronic device manufacturing systems may include one or more process chambers. In some systems, the one or more process chambers may be arranged around a mainframe housing having a transfer chamber and one or more load lock chambers. These systems may employ one or more process chambers that may perform a process on a substrate (e.g., a wafer) inserted into the process chamber. Processing may include a deposition, etch, cleaning or other process. During processing, wafers may rest on a pedestal, platen or other support and may be heated at one or more times during the process. Heating may be provided by resistive heaters in some embodiments. In other embodiments, heating may be provided by exposing the substrate to plasma. In the plasma case, the pedestal (sometimes referred to as an "electro-static chuck" or "platen") may include cooling (e.g., cooling passages in the platen base) and may include other electrical elements as well. It should be recognized, however, that even small variations in temperature across the substrate may cause differential processing (e.g., differential etch, deposition, cleaning or other processing) thereof. Thus, improved precision of temperature control during processing is desired.

Accordingly, systems, apparatus, and methods having improved substrate temperature control in the processing of substrates are desired.

SUMMARY

In one aspect, a substrate temperature control apparatus is provided. The substrate temperature control apparatus includes a base, a thermal contact member proximate to the base, and a plurality of optical fibers adapted to provide light-based heating extending laterally between the base and the thermal contact member.

In another aspect, a substrate temperature control system is provided. The substrate temperature control system includes an optical heating system including a substrate temperature control apparatus including a base and a thermal contact member, and a plurality of optical fibers extending laterally between the base and the thermal contact member, a plurality of light sources coupled to the at least some of the plurality of optical fibers, and an optical controller adapted to control light intensity in the plurality of optical fibers; and a temperature unit coupled to the substrate temperature control apparatus and adapted to provide temperature control in addition to that provided by controlling the light intensity in the plurality of optical fibers.

In another aspect, an electronic device processing system is provided. The electronic device processing system includes a process chamber adapted to carry out a process on a substrate, a substrate temperature control apparatus within the process chamber, the substrate temperature control apparatus including a base and a thermal contact member adapted to be in thermal contact with the substrate, and a plurality of optical fibers extending laterally between the base and the thermal contact member, and a temperature controller coupled to the plurality of optical fibers and adapted to control light intensity in the plurality of optical fibers to provide temperature control of the thermal contact member.

In another aspect, a method of processing substrates is provided. The method includes providing a substrate temperature control apparatus including a base, a thermal contact member proximate to the base, and a plurality of optical fibers extending laterally between the base and the thermal contact member, and controlling light intensity provided to at least some of the plurality of optical fibers to accomplish light-based temperature control of the thermal contact member.

Numerous other aspects are provided in accordance with these and other embodiments of the invention. Other features and aspects of embodiments of the present invention will become more fully apparent from the following detailed description, the appended claims, and the accompanying drawings.

DETAILED DESCRIPTION

Electronic device manufacturing systems may desire very precise temperature processing of substrates. In particular, existing systems may transfer substrates between FOUPs and load locks and then to and from one or more processing chambers where processing takes place. Such electronic device manufacturing systems may include temperature control as processing is taking place, or may include cooling in some embodiments. Various methods have been employed that utilize zoned heating. However, such systems may lack sufficient control.

According to one or more embodiments of the invention, electronic device processing systems adapted to provide improved substrate temperature control are provided. The systems and methods described herein may provide improved temperature control by providing a temperature-controlled platform adapted to thermally control a temperature of a substrate. The temperature control platform may include multiple optical fibers extending laterally and terminating at locations within the platform, where the multiple optical fibers may be used to provide individually or zonally controllable heat sources.

Further details of example temperature control platform apparatus and other embodiments of the invention are described with reference to FIGS. 1-8 herein.

Figure 1:
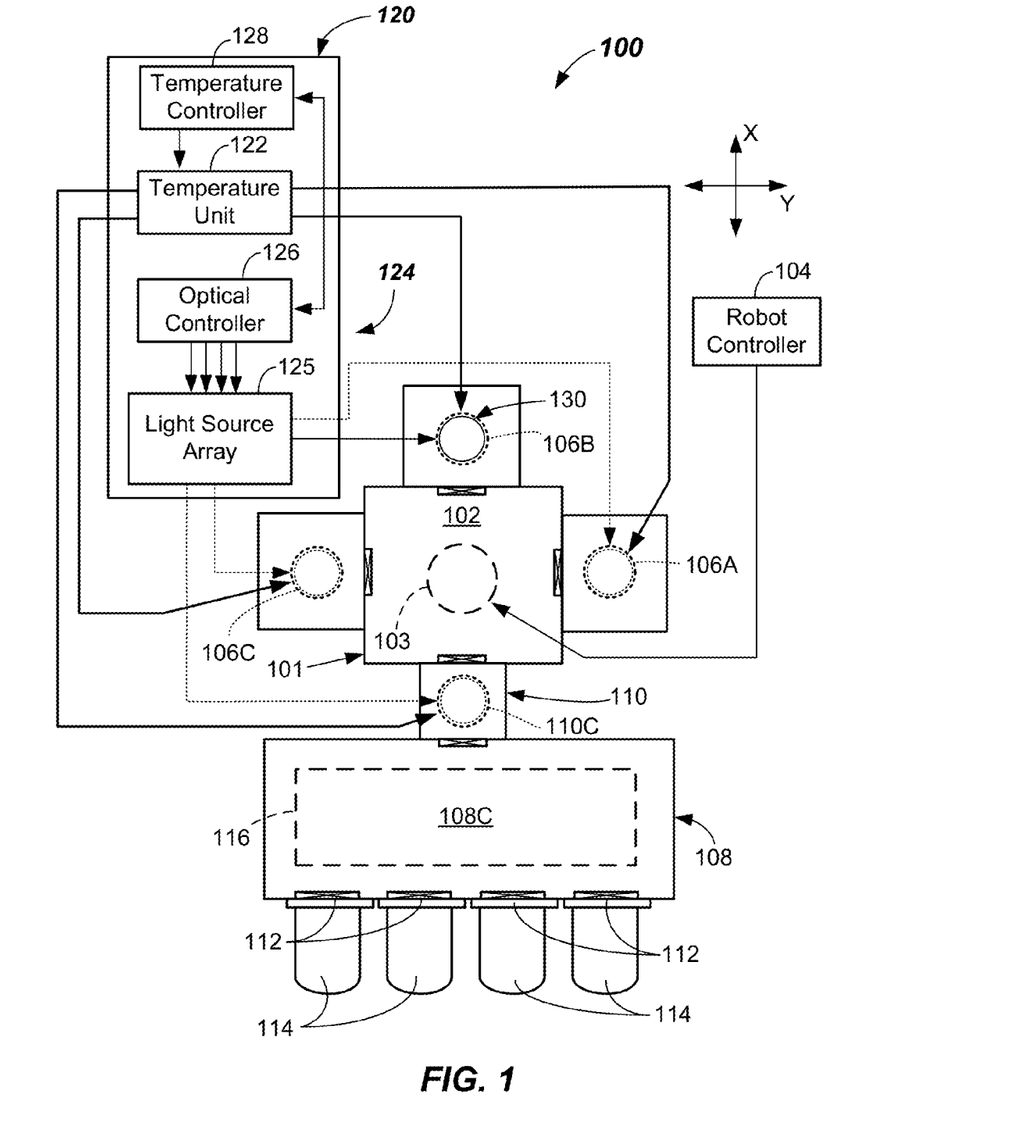
FIG. 1 illustrates a schematic top view of an electronic device processing system including optical fiber heating according to embodiments.

FIG. 1 illustrates a schematic top view diagram of an example embodiment of an electronic device processing system 100 including optical fiber heating according to one or more embodiments of the present invention. The electronic device processing system 100 may include a housing 101 having housing walls defining a transfer chamber 102. Walls may include side walls, floor, and ceiling. A robot 103 (shown as a dotted circle) may be at least partially housed within the transfer chamber 102. The robot 103 may be configured and adapted to place or extract substrates to and from various destinations via operation of moveable arms of the robot 103. "Substrates" as used herein shall mean articles used to make electronic devices or circuit components, such as silicon-containing wafers or articles, patterned silicon wafers or articles, or the like. However, the apparatus and systems described herein may have broad utility wherever temperature control of a substrate is desired. Embodiments of the invention may be useful for both controlled heating and/or controlled cooling.

Robot 103, in the depicted embodiment, may be any suitable type of robot adapted to service the various chambers coupled to, and accessible from, the transfer chamber 102. Robot 103 may be a selective compliance assembly robot arm (SCARA) robot or other suitable robot, such as disclosed in PCT Pub. No. WO2010090983, for example. Other robot types may be used.

The motion of the various arms of the robot 103 may be controlled by suitable commands to a drive assembly (not shown) containing a plurality of drive motors of the robot 103 as commanded from a robot controller 104. Signals from the robot controller 104 may cause motion of the various components of the robot 103 to move substrates between the process chambers 106A-106C and one or more load lock chambers 110C. Suitable feedback mechanisms may be provided for one or more of the components by various sensors, such as position encoders, or the like. The robot 103 may include arms rotatable about a shoulder axis, which may be approximately centrally located in the transfer chambers 102 in some embodiments. Robot 103 may include a base that is adapted to be attached to a wall (e.g., the floor) of the housing 101 forming a lower portion of the transfer chamber 102. However, the robot 103 may be attached to a ceiling in some embodiments.

The rotation of the arms of the robot 103 may be provided by any suitable drive motor, such as a conventional variable reluctance or permanent magnet electric motor. Arms may be adapted to be rotated in an X-Y plane (as shown) relative to the housing 101. Any suitable number of arm components and end effectors (sometimes referred to as "blades") adapted to carry the substrates may be used.

Additionally, the drive assembly of the robot 103 may include Z-axis motion capability in some embodiments. In particular, the motor housing may be restrained from rotation relative to an outer casing by a motion restrictor. Motion restrictor may be two or more linear bearings or other type of bearing or slide mechanisms that function to constrain rotation of the motor housing relative to the outer casing, yet allow Z-axis (vertical) motion of the arms along the vertical direction (into and out of the paper in FIG. 1). A suitable sealing member may seal between the motor housing and the base thereby accommodating the vertical motion, and retaining a vacuum within the transfer chamber 102 in some embodiments.

The transfer chamber 102 in the depicted embodiment may have one or more process chambers 106A-106C coupled to and accessible therefrom. The process chambers 106A-106C may be coupled to facets of the housing 101, and each process chamber 106A-106C may be configured and operable to carry out a suitable process on the substrates delivered thereto by robot 103. The process may be any suitable process, such as PVD or CVD, etch, annealing, cleaning, pre-clean, oxide removal, or the like. Other suitable processes may be carried out on the substrates therein. One or more of the processes taking place in the process chambers 106A-106C may include temperature control in accordance with an aspect of the invention.

Within the electronic device processing system 100, substrates may be received from a factory interface 108, and also exit the transfer chamber 102 into the factory interface 108 through a load lock apparatus 110. The factory interface 108 may be any enclosure having wall surfaces forming the factory interface chamber 108C wherein one or more load ports 112 are provided on some surfaces and are configured and adapted to receive (e.g., dock) one or more substrate carriers 114 (e.g., front opening unified pods or FOUPs) such as at a front surface thereof.

Factory interface 108 may include a suitable load/unload robot 116 (shown dotted) of conventional construction within a factory interface chamber 108C. The load/unload robot 116 may be configured and operational to extract substrates from the interior of the one or more substrate carriers 114 and feed the substrates into the one or more load lock chambers 110C of load lock apparatus 110.

In some embodiments, a temperature unit 122 (FIG. 2) coupled to one or more thermal elements 242 (e.g., resistive elements) may be used in conjunction with optical fiber heating to control a temperature of a substrate to a desired temperature.

Such temperature control using optical fiber heating may be included in one or more of the process chambers 106A-106C. Optionally or additionally, the load lock apparatus 110, which may be a SWLL (e.g., single wafer load lock) may include temperature control in some embodiments. Thus, in some embodiments, optical fiber heating may be included within one or more of the process chambers 106A-106C, and also within the load lock apparatus 110. In one or more other embodiments, optical fiber heating may be included in one or more of the process chambers 106A-106C, but not in the load lock apparatus 110. In another embodiment, optical fiber heating may be included in load lock apparatus 110, but not in one or more of the process chambers 106A-106C.

The temperature control may be provided by a substrate temperature control system 120. Substrate temperature control system 120 may be subpart of the electronic device processing system 100. Substrate temperature control system 120 may include a temperature unit 122 that may couple to thermal elements 242 (e.g., resistive heating elements or thermal passages) and constitute a primary source of temperature control (e.g., heating or cooling) to one or more of the chambers (e.g., process chambers 106A, 106B, 106C and/or load lock chamber 110C). An optical heating system 124 may operate as a supplemental heating system in conjunction with the temperature unit 122 and thermal elements in some embodiments. In other embodiments, the optical heating system 124 may be the only heating system.

Optical heating system 124 may include a light source array 125 coupled (e.g., optically coupled) to a substrate temperature control apparatus 130, and an optical controller 126. Substrate temperature control system 120 may include a temperature controller 128 operational to control temperature of the substrate that is being temperature controlled within the chamber (e.g., process chamber 106B). Temperature controller 128 may be operational to control the temperature unit 122 and may interface with the optical controller 126 in some embodiments. Thus, the temperature controller 128 may be used to communicate with the optical controller 126 and the temperature unit 122 to control a temperature of the substrate in thermal contact with the substrate temperature control apparatus 130. Suitable temperature feedback may be provided from one or more locations.

Figure 2:
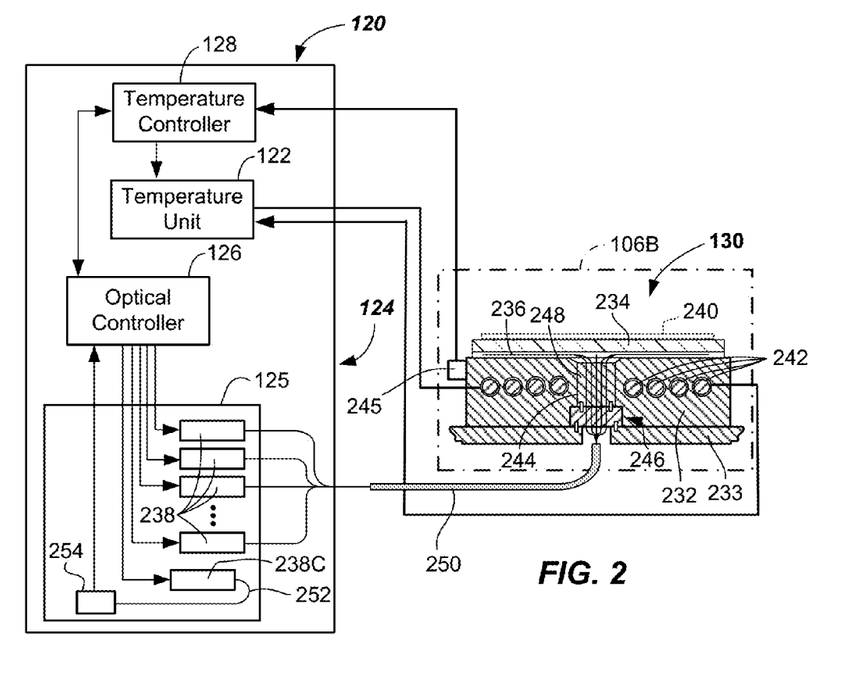
FIG. 2 illustrates a schematic partially cross-sectioned side view of a substrate temperature control system including optical fiber heating according to embodiments.

Now referring now to FIG. 2, substrate temperature control system 120 including optical heating system 124 is described in more detail. Optical heating system 124 may include a substrate temperature control apparatus 130, which may be a platform on which a substrate 240 (shown dotted) may rest or be in thermal contact with. Substrate temperature control apparatus 130, as shown, includes a base 232, which may be supported by support structure 233, a thermal contact member 234 proximate to the base 232, and a plurality of optical fibers 236 that extend laterally between the base 232 and the thermal contact member 234. Extending laterally, as used herein, means the length of the optical fiber (along its longitudinal axis) passes horizontally in the space between the thermal contact member 234 and the base 232 in an orientation that may be substantially parallel to a upper surface plane of the thermal contact member 234. Some slight deviation from parallel is possible due to laying the optical fibers 236 in the bonding layer, as will be apparent from the following.

The plurality of optical fibers 236 are adapted to provide light-based heating. At least some of the plurality of optical fibers 236 extend laterally between the base 232 and the thermal contact member 234. The plurality of optical fibers 236 may terminate at multiple radial locations between the thermal contact member 234 and the base 232 (see FIG. 3, for example). Optical fibers 236 may pass through the base 232 as a bundle (e.g., as a group of fibers) and then bend and extend laterally. Optical heating system 124 may include the light source array 125 including a plurality of light sources 238 coupled to the at least some, and preferably most or all, of the plurality of optical fibers 236. The optical controller 126 may be configured to control light intensity channeled into, and carried by, the plurality of optical fibers 236.

In operation, light carried in at least some of the plurality of optical fibers 236 is used to heat local portions of the thermal contact member 234. With the termination of the plurality of optical fibers 236 bent and then positioned at desired locations, many local portions of the thermal contact member 234 may be heated. In some embodiments, this localized heating may be in conjunction with temperature control provided by the temperature unit 122 (either heating or cooling) and the thermal elements 242. In other embodiments, the localized heating by the plurality of optical fibers 236 may be the only heating provided.

For example, temperature control may, in some embodiments, cause the substrate 240 (shown dotted) to be heated to a nominal temperature of greater than about 350 degrees C., greater than about 400 degrees C., greater than about 500 degrees C., greater than about 550 degrees C., greater than about 600 degrees C., or an even greater temperature. For example, temperature control may, in some embodiments, cause the substrate 240 (shown dotted) to be heated to a nominal temperature of between about 500 degrees C. and about 650 degrees C. Such heating may be carried out on substrates 240 within the one or more process chambers 106A-106C in some embodiments. For example, temperature control may, in some embodiments, cause the substrate 240 (shown dotted) to be heated, such as in a plasma deposition (PECVD) embodiment.

Process chamber 106B is shown as an example in FIG. 2. However, such temperature control including optical fiber heating may be used in process chambers 106A and/or 106C in addition to, or in place of, process chamber 106B. Other forms or types of process chambers may incorporate the optical fiber heating. Furthermore, such temperature control including optical fiber heating may be provided before the substrates 240 are passed into the transfer chamber 102 from the factory interface 108 in some embodiments, such as within load lock apparatus 110.

Optical fiber heating may be used to provide controlled heating to various localized radial portions of the substrate 240. The optical fiber heating may be provided as a supplement to other forms of heating or cooling as described herein. For example, each fiber of the plurality of optical fibers 236 may be used to locally heat one small underside region of the thermal contact member 234 adjacent to the location of termination of the optical fiber 236. Each optical fiber 236 may be used to adjust a localized temperature between temperature bounds, such as between about +/−10 degrees C. from the nominal, +/−20 degrees C. from the nominal, or even +/−30 degrees C. from the nominal, for example. Other temperature adjustment magnitudes may be accomplished by using light sources 238 that are more or less powerful (having more or less light output intensity). Thus, temperature control may be implemented by the optical fiber heating on a pixelated basis. Some of the optical fibers 236 may include a diffuser at the fiber termination. Diffuser may be used to direct light to one or more surface of the diffuser or otherwise minimize light reflection back into the optical fiber 236.

Operation of the optical fiber heating will now be described. For example, if the nominal desired temperature of the substrate 240 is about 550 degrees C., but geometrical or thermal anomalies or other differences in the process chamber 106B or the pedestal make it difficult to achieve that nominal temperature across all parts of the substrate 240, then auxiliary heating may be provided by the optical heating system 124. Auxiliary heating may be provided, in one or more embodiments, by the optical heating system 124 to adjust localized regions in order to meet desired temperature uniformity everywhere. In other embodiments, optical heating system 124 may be used to adjust localized regions to provide a temperature profile on the substrate 240, as desired. The desired temperature profile may be non-uniform is some embodiments. It should also be apparent that in some embodiments, the optical heating system 124 may be the only source of heating, i.e., no temperature unit 122 is present). In this embodiment, the optical controller 126 is the only temperature controller present and is used to adjust temperature of localized regions.

In more detail, the base 232 may be a thermally conducting material, such as aluminum or aluminum nitride, and may include one or more thermal elements 242 (e.g., resistive heater elements as shown) or other suitable thermal elements formed therein or thereon. Thermal elements 242 may be coupled to temperature unit 122, which may be an electrical power driver in some embodiments. Temperature controller 128 may be used to set and control a desired nominal temperature target of the base 232. One or more temperature sensors 245 may be provided in thermal contact with the substrate temperature control apparatus 130, such as on the base 232 thereof. The one or more temperature sensors 245 may provide temperature feedback to the temperature controller 128.

Figure 3:
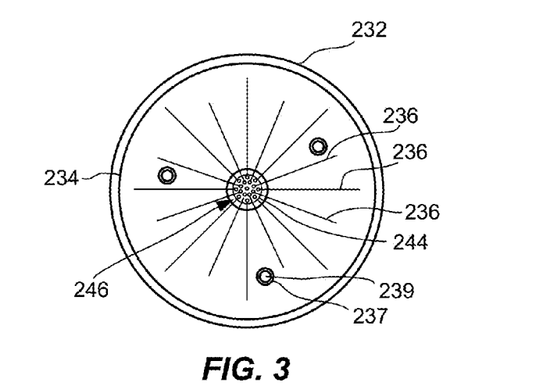
FIG. 3 illustrates a schematic top view of a portion of a substrate temperature control apparatus according to embodiments (with the thermal contact member removed to show positioning of the optical fibers).

In the depicted embodiment of FIGS. 2 and 3, the base 232 may include one or more passages 244 through which the plurality of optical fibers 236 may enter. The plurality of optical fibers 236 may enter as a bundle though the passage 244 and into a space between the base 232 and the thermal contact member 234. Other secondary passages 237 may be included for lift pins 239, for temperature probes, or the like. In FIG. 3, the one or more passages 244 is a single, centrally-located passage, but multiple passages (e.g., passages 444A-444D) may be used in some embodiments (See FIG. 4 for example). Other numbers of passages 244 may be used to pass bundles of optical fibers 236 through the base 232. Once passing through the one or more passage 244, the optical fibers 236 are bent (e.g., at an approximate 90 degree angle) and extend out laterally (e.g., radially in some embodiments) from the bundle(s) entering through the one or more passages 244. Optical fibers 236 may be of various lengths and may extend laterally to various desired radial locations underneath the thermal contact member 234. Bending of the fibers may include annealing so that the bent shape may be retained.

In the depicted embodiment of FIGS. 2 and 3, optical fibers 236 may pass through, and be constrained by, a ferrule 246 within at least some portion of the passage 244. For example, ferrule 246 may be located at a bottom, top, or middle of the passage 244. Ferrule 246 operates as a guide to separate the optical fibers 236 and to make them easier to identify. Further, ferrule 246 may extend them in an organized way to the top of the base 232, so that may be routed (e.g., bent or otherwise oriented) to the desired lateral location in an organized way. Ferrule 246 may rotationally orient the bundle of optical fibers 236 relative to the base 232.

Figure 5:
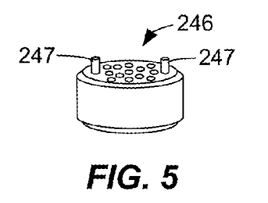
FIG. 5 illustrates a perspective view of a ferrule used to orient optical fibers in the substrate temperature control apparatus according to embodiments.

For example, ferrule 246, as best shown in FIG. 5, may include one or more orienting features 247 (e.g., one or more pins) to rotationally orient the ferrule 246 and the bundle of optical fibers 236 passing there through relative to the base 232. Other types of orientating features may be used. Ferrule 246 may be made of any suitable material, such as a ceramic. Other suitable materials may be used. Ferrule 246 may be mounted to the base 232 in any suitable manner, such as by bonding. Ferrule 246 may be bonded with an epoxy adhesive into a pocket formed in the base 232, in some embodiments. Ferrule 246 may include a plurality of longitudinally-extending holes that are adapted to accept individual ones of the optical fibers 236 therein. Between about 20 and about 300 holes that are generally axially co-parallel may be provided in each ferrule 246. Other numbers of holes may be used.

Figure 6:
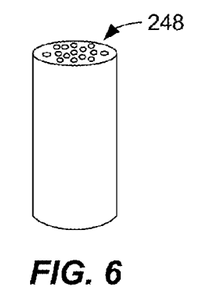
FIG. 6 illustrates a perspective view of a multi-lumen extension used to pass optical fibers within the substrate temperature control apparatus according to embodiments.

In one or more embodiments, an extension 248 may be provided, such as a multi-lumen extension, to guide and pass the optical fibers 236 closer to the top surface of the base 232. A diagram of an extension 248 (e.g., a multi-lumen extension) is shown in FIG. 6. Extension 248 may be Teflon or other suitable material. Like the ferrule 246, the extension 248 may include longitudinal holes which carry the optical fibers 236. One or more of the holes may be used to align the extension 248 with the ferrule 246 via the use of the orienting features 247.

The optical controller 126 may be any suitable controller having suitable processor, memory, and peripheral components adapted to execute a closed loop or other suitable control scheme and control the optical power (e.g., Watts) emanating from each of the light sources 238 of the light source array 125. At least some of the light sources 238 are coupled to the optical fibers 236 and provide optical power thereto (e.g., infrared energy). Optical fibers 236 may be arranged in a bundle (as shown) and may include a protective sheath 250 over at least some of the length.

Optical fibers 236 may include any suitable optical fiber type, such as graded-index optical fiber, step-index single mode optical fiber, multi-mode optical fiber, or even photonic crystal optical fiber. Optical fibers 236 that exhibit relatively high bend resistance may be used. Relatively high numerical aperture (NA) fibers may be used, such as NA of greater than about 0.1, greater than about 0.2, or even greater than about 0.3. NA of about 0.22 may be used in some embodiments. Any suitable number of optical fibers 236 may be used, such as 100 or more, 200 or more 300 or more, or even more. Optical fibers 236 may be coupled to the light source 238 by any suitable means.

In some embodiments, one or more of the light sources 238 may be coupled by a sensor fiber 252 to a control sensor 254, such as a light receiver. Each light source 238 may be a laser diode, such as a single emitter diode. The laser diode may have any suitable output wavelength range, such as between about 915 nm and about 980 nm, for example. Other output ranges may be used. Output power may be between about 0 W to 10 W. However, ever higher power diodes (e.g., >10 W) may be used. The laser diode may include an optical fiber output having a 105 or 110 micron aperture, for example. For example, a model PLD-10 from IPG Photonics of Oxford, Mass. may be used. Other types of light sources may be alternatively used.

A control sensor 254 may be used to provide feedback to the optical controller 126 on the output of a control light source 238C (e.g., of light intensity or heat generation, for example). Each light source 238 may be individually controlled from a low or zero level of light output to a high or maximum level of light output. Each light source 238 may be individually controlled in order to control temperature at finite points (pixels) or collectively controlled in groups to control temperatures of region or zones.

Any suitable temperature control philosophy may be implemented. In one control aspect, a highly uniform temperature distribution across a surface of the substrate 240 may be sought. In another aspect, a deliberately non-uniform temperature distribution may be desired. Each may be provided, as desired, in accordance with aspect of the invention depending on the control philosophy implemented by the optical controller 126. Some embodiments of the invention may therefore provide azimuthal temperature variations.

The thermal contact member 234 may be provided above the base 232 and the optical fibers 236 may be laid and extend laterally within a space between the base 232 and the thermal contact member 234. Within the space, a suitable bonding material may be used. The optical fibers 236 may be bonded within this space in defined orientations. One bonding material may be a silicone material including a ceramic dopant. Other suitable thermally conductive and pliable relatively high temperature materials may be used. The thermal contact member 234 may be a ceramic material, such as an alumina or aluminum nitride and may have a disc shape, for example. Bond thickness of the bonding material may be between about 0.010 inch to about 0.030 inch (about 0.254 mm to about 0.762 mm), for example. Other bond thicknesses may be used. In the case where the base 232 and the thermal contact member 234 are both ceramic, a ceramic adhesive, such as a ceramic loaded epoxy, may be used.

Figure 4:
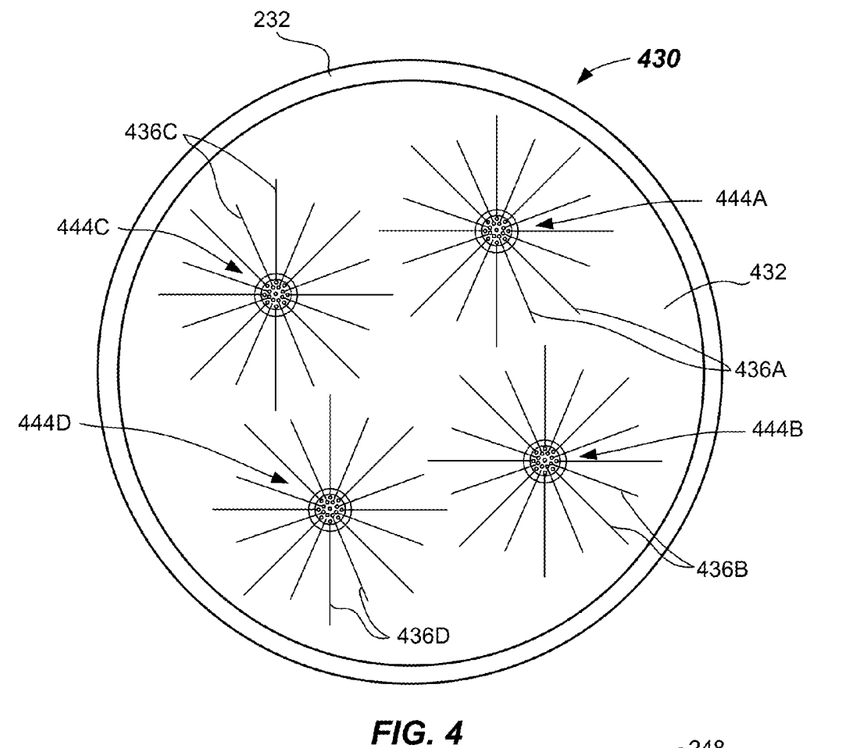
FIG. 4 illustrates a schematic top view of a portion of a substrate temperature control apparatus according to embodiments (with the thermal contact member removed to show positioning of the optical fibers) and multiple optical fiber bundle entry locations.

FIG. 4 illustrates an embodiment of the substrate temperature control apparatus 430, with the thermal contact member removed, including multiple passages 444A, 444B, 444C, 444D through the base 432 through which bundles of optical fibers 436A, 436B, 436C, 436D may pass may be provided. In the depicted embodiment, four passages 444A, 444B, 444C, 444D are shown. However fewer or more passages may be provided. The optical fibers 436A, 436B, 436C, 436D may extend laterally and be positioned at various planar locations.

Figure 7:
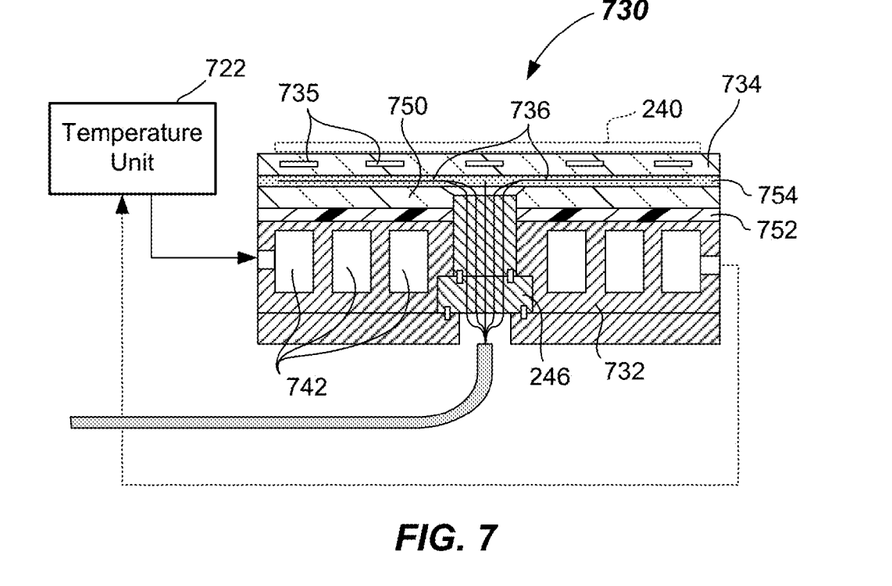
FIG. 7 illustrates a schematic partially cross-sectioned side view of a substrate temperature control system including an intermediate member and optical fiber heating according to embodiments.

Another embodiment of substrate temperature control apparatus 730 is shown in FIG. 7. This embodiment includes a base 732 and a thermal contact member 734 with a plurality of optical fibers 736 extending laterally there between as before. In this embodiment, base 732 may include, as shown a thermal elements 742 comprising a plurality of fluid circulation channels. Fluid circulation channels may include a temperature control liquid (e.g., a coolant) which may be provided from the temperature unit 722 and circulate through the fluid circulation channels and may return to the temperature unit 722. The temperature control liquid may flow to a drain in some embodiments. Temperature unit 722 may provide cooling of the thermal contact member 734 and thus of the substrate 240 that is in thermal contact therewith. For example, in plasma processing (e.g., plasma etch), it may be desired to cool the substrate 240. Electrostatic clamp electrodes 735 may be provided in the thermal contact member 734, when the assembly is embodied as an electro-static chuck.

In the depicted embodiment, an intermediate member 750 may be provided in between the base 732 and the thermal contact member 734. Intermediate member 750 may be a plate, such as a ceramic plate made of alumina or aluminum nitride. The intermediate member 750 may have a thickness of between about 1 mm to about 5 mm, or about 2 mm, for example. Other thicknesses may be used. Intermediate member 750 may be bonded to the base 732, such as by a first bonding layer 752 of a thermally conductive elastomer material (e.g., ceramic-doped silicone material). Other suitable bonding materials may be used. A thickness of the first bonding layer 752 may be chosen to achieve a desired thermal resistance and flexibility. Bond thickness values of between about 0.254 mm to 0.762 mm for the first bonding layer 752 may be used, depending on the properties of the particular bonding material. The intermediate member 750 may have one or more holes therein adapted to allow the bundle of optical fibers 736 to pass there through. A ferrule 246 and/or an extension 248, as heretofore described, may be employed to orient and organize the optical fibers 736.

The substrate temperature control apparatus 730 may include a second bonding layer 754 between the intermediate member 750 and the thermal contact member 734. Second bonding layer 754 may be a thermally conductive adhesive material (e.g., ceramic-loaded adhesive material). Other suitable bonding materials may be used. An alumina-based adhesive may be used, for example, such as CERAMABOND™ 503 available from Aremco Products, Inc. of Valley Cottage, N.Y. The particular ceramic adhesive may be selected for its relatively high thermal conductivity and a coefficient of thermal expansion that substantially matches that of the intermediate member 750.

In one or more embodiments, a thin layer portion of the second bonding layer 754 may be applied to the top of the intermediate member 750. Optical fibers 736 of pre-measured length may be fed through the ferrule 246 and extension 248 and bent or positioned into place. A desired position for the termination (e.g., fiber tip) can be illustrated for an assembly technician by using an automated indicating laser placing a laser dot at a desired termination location. Optical fibers 736 may be held in place by the thin layer portion of the second bonding layer 754. Optical fibers 736 having outside diameters in the range of 100 microns to 200 microns are sufficiently flexible that the bend can be easily made, or they may be pre-bent and annealed to retain their bend. Optical fibers 736 may include a diffuser at their tips as heretofore described.

After the full complement of optical fibers 736 has been positioned as desired, a further layer portion of second bonding layer 754 may be added to cover the optical fibers 736. Degassing in a vacuum chamber may be implemented to remove air bubbles around the optical fibers 736. Once cured, the surface of the further layer portion of second bonding layer 754 may be machined flat.

The thermal contact member 734, which may be a ceramic plate, may be subsequently bonded to the further layer portion of second bonding layer 754. In one or more embodiments, the subsequent bonding may be by the use of a ceramic-loaded elastomer material, such as a ceramic-loaded silicone, or the like. The elastomer material may be loaded with a ceramic material such as an aluminum nitride, alumina, or the like. Other ceramic materials may be included alone or in combination.

In some embodiments, the thermal contact member 734 (e.g., uppermost plate) may contain the electrostatic clamp electrode 735, which may be present when embodied as an electrostatic chuck (ESC) assembly. The elastomer bond provides a thermal resistance which diffuses the energy from the optical fibers (effectively a point source) into a relatively smooth temperature profile on the surface of the thermal contact member 734 suitable for wafer temperature control. In some embodiments, the thermal contact member 734 may also include resistive heater elements therein.

For example, temperature control may, in this embodiment, cause the substrate 240 (shown dotted) to be temperature controlled to a nominal temperature of between about −20 degrees C. and about 120 degrees C.

Figure 8:
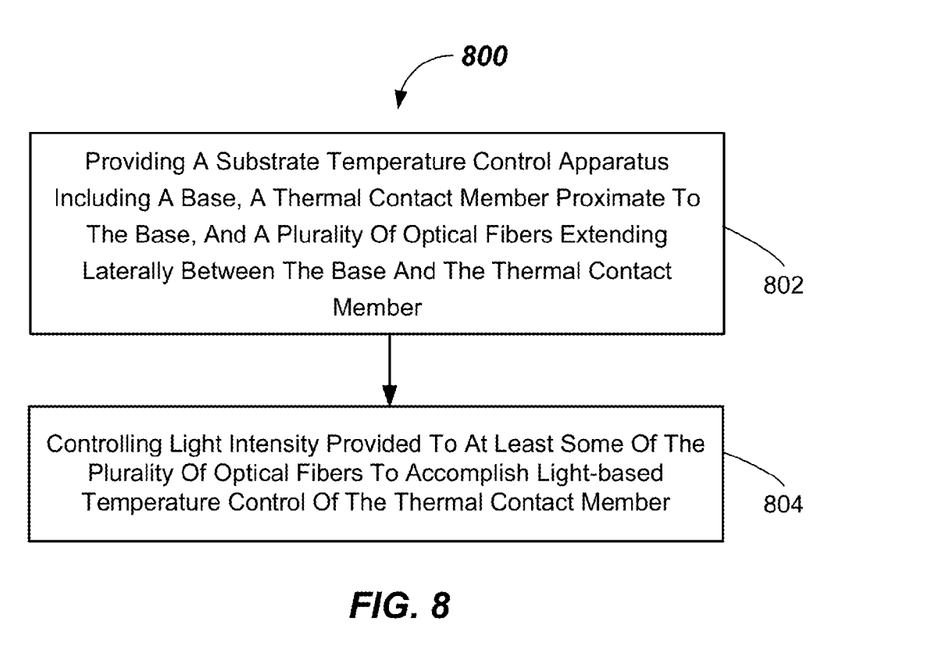
FIG. 8 illustrates a flowchart depicting a method of processing substrates according to embodiments.

A method 800 of processing substrates within an electronic device processing system (e.g., electronic device processing system 100) will be described with reference to FIG. 8 herein. The method 800 includes, in 802, providing a substrate temperature control apparatus (e.g., substrate temperature control apparatus 130, 730) including a base (e.g., base 232, 732), a thermal contact member (e.g., thermal contact member 234, 734) proximate to the base, and a plurality of optical fibers (e.g., optical fibers 236, 736) extending laterally between the base and the thermal contact member.

The method 800 includes, in 804, controlling light intensity provided to at least some of the plurality of optical fibers to accomplish light-based temperature control of the thermal contact member. Of course, temperature control of the thermal contact member also controls temperature of the substrate (e.g., substrate 240) in thermal contact therewith. In one or more embodiments, the method 800 may further comprise heating or cooling the substrate temperature control apparatus by way of a coupled temperature unit (e.g., temperature unit 122, 722).

The foregoing description discloses only example embodiments of the invention. Modifications of the above-disclosed apparatus, systems, and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:

1. A substrate temperature control apparatus, comprising:
   a base;
   a thermal contact member proximate to the base, the thermal contact member is configured to provide heating of a substrate in thermal contact with the thermal contact member; and
   a plurality of optical fibers adapted to provide light-based heating extending laterally between the base and the thermal contact member, the plurality of optical fibers entering as a bundle into a space between the base and the thermal contact member through a passage through the base.

2. The substrate temperature control apparatus of claim 1, wherein the plurality of optical fibers terminate at multiple radial locations between the thermal contact member and the base.

3. The substrate temperature control apparatus of claim 1, wherein the base includes thermal control.

4. The substrate temperature control apparatus of claim 1, wherein the base comprises a conductive metal.

5. The substrate temperature control apparatus of claim 1, wherein the thermal contact member comprises a ceramic.

6. The substrate temperature control apparatus of claim 1, wherein the plurality of optical fibers pass through a ferrule mounted to the base.

7. The substrate temperature control apparatus of claim 1, comprising an intermediate member positioned between the base and the thermal contact member.

8. The substrate temperature control apparatus of claim 1, comprising an intermediate member positioned between the base and the thermal contact member, and a first bonding layer between the intermediate member and the base.

9. The substrate temperature control apparatus of claim 8, wherein the first bonding layer comprises a ceramic-loaded elastomer.

10. The substrate temperature control apparatus of claim 8, comprising a second bonding layer between the intermediate member and the thermal contact member and wherein the plurality of optical fibers extend laterally between the intermediate member and the thermal contact member.

11. The substrate temperature control apparatus of claim 10, wherein the second bonding layer comprises a ceramic adhesive and a ceramic loaded elastomer.

12. The substrate temperature control apparatus of claim 8, wherein the plurality of optical fibers are encapsulated in a ceramic adhesive.

13. A substrate temperature control system, comprising:
    an optical heating system including:
        a substrate temperature control apparatus including a base and a thermal contact member, and a plurality of optical fibers extending laterally between the base and the thermal contact member, wherein the thermal contact member is configured to provide heating of a substrate in thermal contact with the thermal contact member and the plurality of optical fibers enter into a space between the base and the thermal contact member through a multi-lumen extension,
        a plurality of light sources coupled to at least some of the plurality of optical fibers, and
        an optical controller adapted to control light intensity in the plurality of optical fibers; and
    a temperature unit coupled to the substrate temperature control apparatus and adapted to provide temperature control in addition to that provided by controlling the light intensity in the plurality of optical fibers.

14. An electronic device processing system, comprising:
    a process chamber adapted to carry out a process on a substrate;
    a substrate temperature control apparatus within the process chamber, the substrate temperature control apparatus including a base and a thermal contact member adapted to be in thermal contact with the substrate wherein the thermal contact member is configured to provide heating of the substrate, an intermediate member positioned between the base and the thermal contact member, a first bonding layer comprising a ceramic-loaded elastomer between the intermediate member and the base, and a plurality of optical fibers extending laterally between the base and the thermal contact member; and
    a temperature controller coupled to the plurality of optical fibers and adapted to control light intensity in the plurality of optical fibers to provide temperature control of the thermal contact member.

15. The electronic device processing system of claim 14, wherein the plurality of optical fibers enter as a bundle into a space between the base and the thermal contact member through a passage through the base.

16. The electronic device processing system of claim 14, wherein the plurality of optical fibers enter into a space between the base and the thermal contact member through a multi-lumen extension.

17. The electronic device processing system of claim 14 wherein the temperature controller comprises a plurality of laser diodes coupled to the at least some of the plurality of optical fibers.

18. The electronic device processing system of claim 14 further comprising a temperature unit coupled to the substrate temperature control apparatus and adapted to provide temperature control in addition to that provided by controlling the light intensity in the plurality of optical fibers.

19. A method of processing substrates, comprising:
    providing a substrate temperature control apparatus including a base, a thermal contact member proximate to the base, an intermediate member positioned between the base and the thermal contact member, and a first bonding layer between the intermediate member and the base, and a plurality of optical fibers encapsulated in a ceramic adhesive extending laterally between the base and the thermal contact member; and
    controlling light intensity provided to at least some of the plurality of optical fibers to accomplish light-based temperature control of the thermal contact member and provide heating of a substrate in thermal contact with the thermal contact member.

20. The method of claim 19, comprising heating or cooling the substrate temperature control apparatus by way of a coupled temperature unit.

* * * * *